(12) United States Patent
Chiu et al.

(10) Patent No.: US 12,432,994 B2
(45) Date of Patent: Sep. 30, 2025

(54) SOURCE/DRAIN METAL CONTACT AND FORMATION THEREOF

(71) Applicant: Taiwan Semiconductor Manufacturing Co., Ltd., Hsin-Chu (TW)

(72) Inventors: Shih-Chuan Chiu, Hsinchu (TW); Tien-Lu Lin, Hsinchu (TW); Yu-Ming Lin, Hsinchu (TW); Chia-Hao Chang, Hsinchu (TW); Chih-Hao Wang, Hsinchu (TW); Jia-Chuan You, Taoyuan County (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 0 days.

(21) Appl. No.: 18/520,996

(22) Filed: Nov. 28, 2023

(65) Prior Publication Data

US 2024/0096961 A1  Mar. 21, 2024

Related U.S. Application Data

(60) Continuation of application No. 17/352,682, filed on Jun. 21, 2021, now Pat. No. 11,855,144, which is a division of application No. 16/556,922, filed on Aug. 30, 2019, now Pat. No. 11,043,558.

(60) Provisional application No. 62/753,375, filed on Oct. 31, 2018.

(51) Int. Cl.
| | | |
|---|---|---|
| H01L 29/66 | (2006.01) |
| H01L 21/768 | (2006.01) |
| H10D 30/01 | (2025.01) |
| H10D 30/62 | (2025.01) |
| H10D 62/13 | (2025.01) |
| H10D 64/01 | (2025.01) |

(52) U.S. Cl.
CPC ..... *H10D 62/151* (2025.01); *H01L 21/76871* (2013.01); *H10D 30/024* (2025.01); *H10D 30/62* (2025.01); *H10D 64/017* (2025.01)

(58) Field of Classification Search
CPC ........... H01L 29/0847; H01L 29/66545; H01L 29/785; H01L 59/785
See application file for complete search history.

(56) References Cited

U.S. PATENT DOCUMENTS

| | | |
|---|---|---|
| 6,251,777 B1 | 6/2001 | Jeng et al. |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |

(Continued)

FOREIGN PATENT DOCUMENTS

TW   201724273   7/2017

*Primary Examiner* — Dale E Page
*Assistant Examiner* — Wilner Jean Baptiste
(74) *Attorney, Agent, or Firm* — HAYNES AND BOONE, LLP

(57) ABSTRACT

A contact stack of a semiconductor device includes a source/drain feature, a silicide layer wrapping around the source/drain feature, a seed metal layer in direct contact with the silicide layer, and a conductor in contact with the seed metal layer. The contact stack excludes a metal nitride layer in direct contact with the silicide layer.

20 Claims, 14 Drawing Sheets

(56) References Cited

U.S. PATENT DOCUMENTS

| | | |
|---|---|---|
| 9,236,267 B2 | 1/2016 | De et al. |
| 9,236,300 B2 | 1/2016 | Liaw |
| 9,472,502 B1 | 10/2016 | Lee et al. |
| 9,520,482 B1 | 12/2016 | Chang et al. |
| 9,576,814 B2 | 2/2017 | Wu et al. |
| 10,566,201 B1 * | 2/2020 | Park .................. H10D 84/038 |
| 10,734,280 B2 | 8/2020 | Yim et al. |
| 10,832,946 B1 | 11/2020 | Choi et al. |
| 2005/0239242 A1 * | 10/2005 | Zhu .................. H01L 29/785 |
| | | 257/E21.703 |
| 2016/0035624 A1 | 2/2016 | Ogiso |
| 2016/0315081 A1 | 10/2016 | Park et al. |
| 2018/0130707 A1 | 5/2018 | Clendenning et al. |
| 2019/0148226 A1 * | 5/2019 | Yim .................. H01L 29/6656 |
| | | 257/383 |
| 2020/0135858 A1 | 4/2020 | Chiu et al. |

* cited by examiner

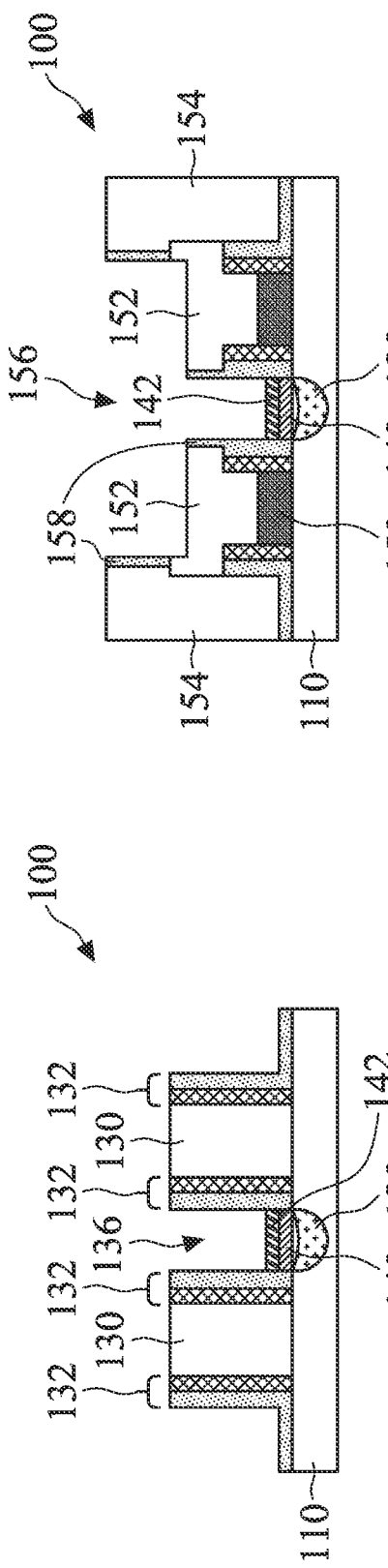
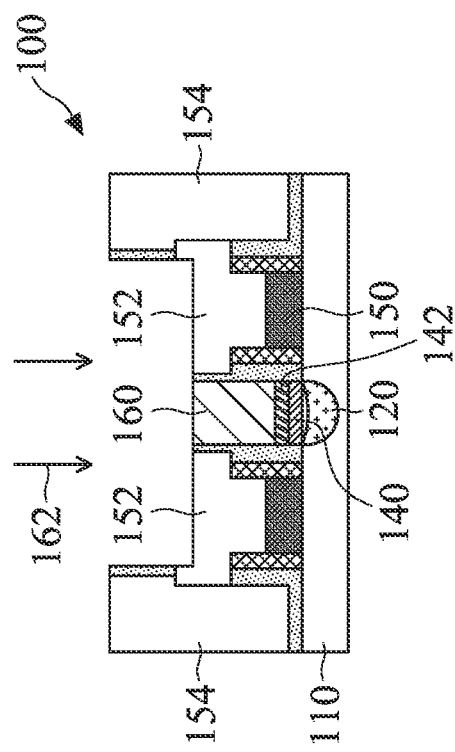

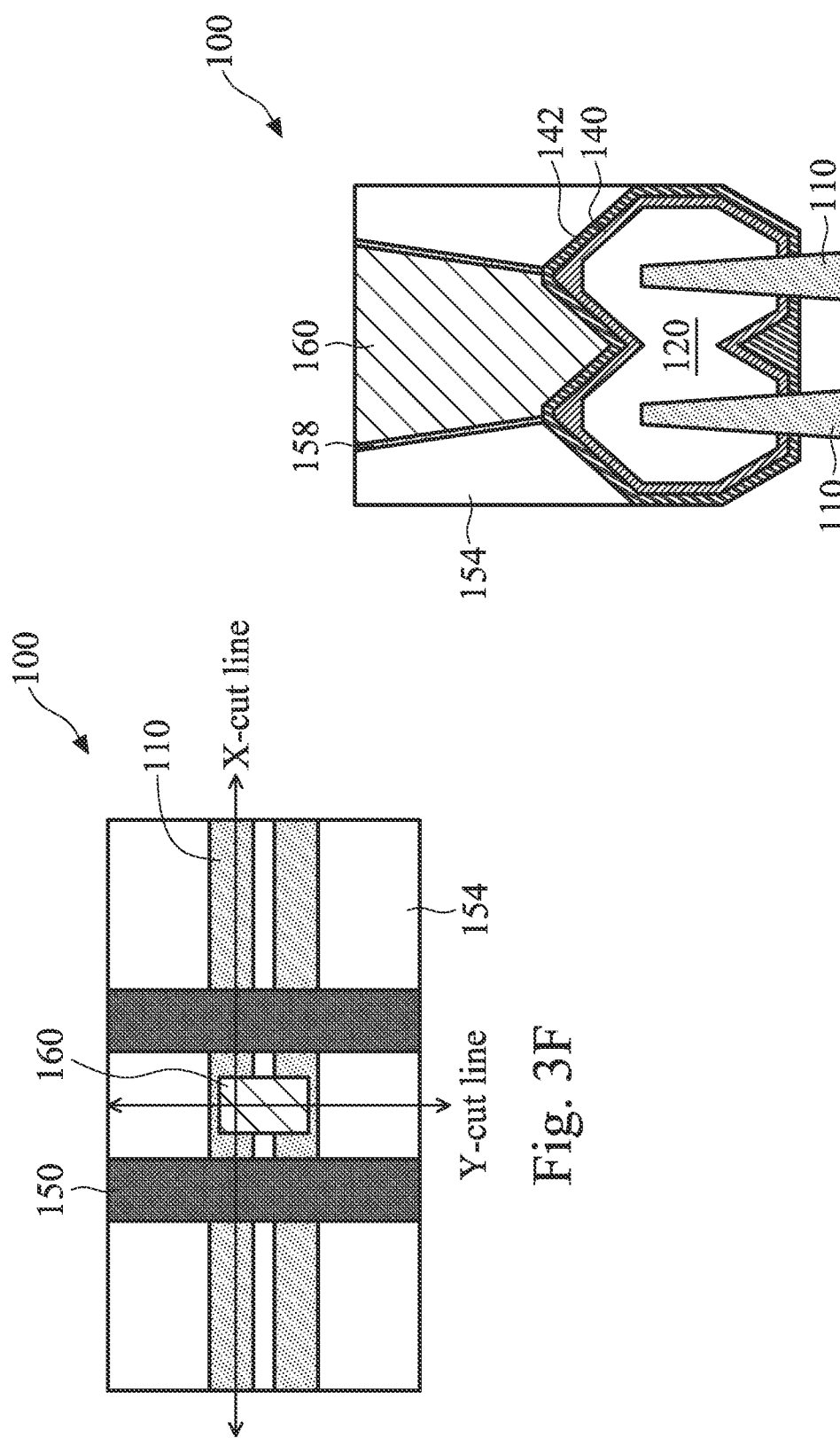

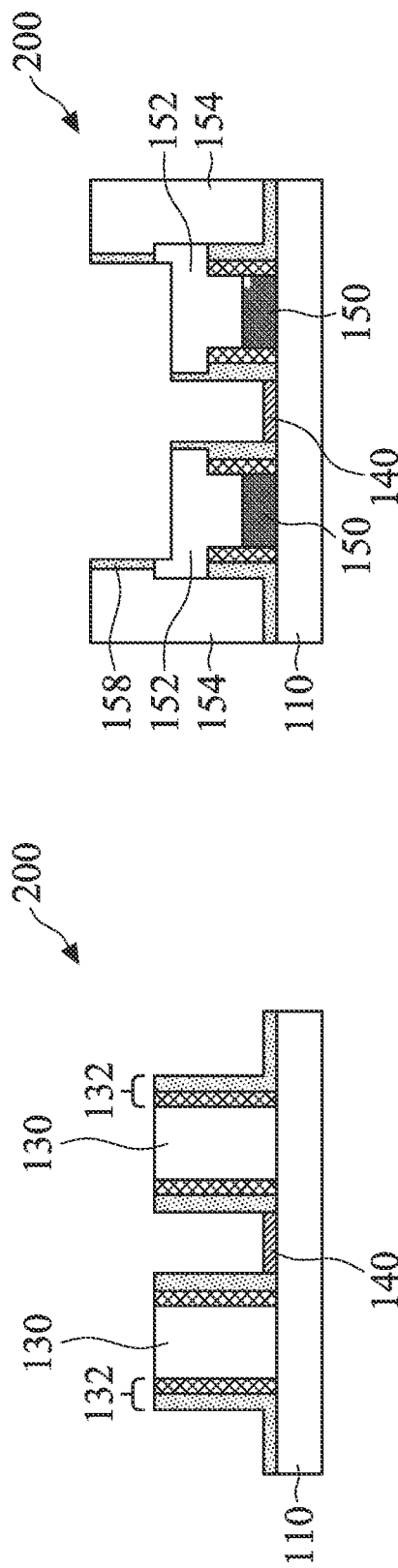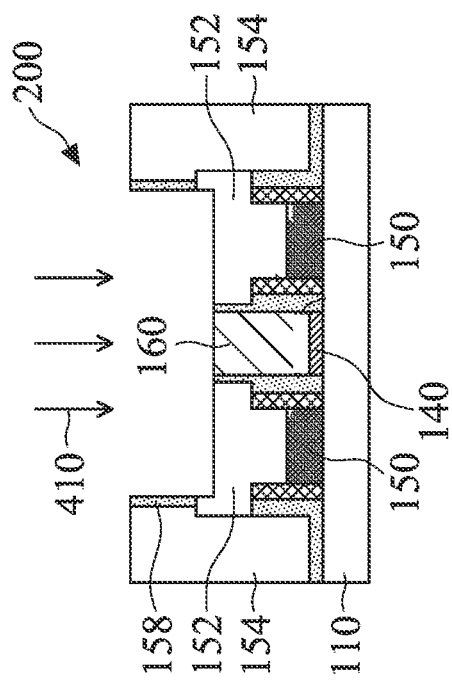

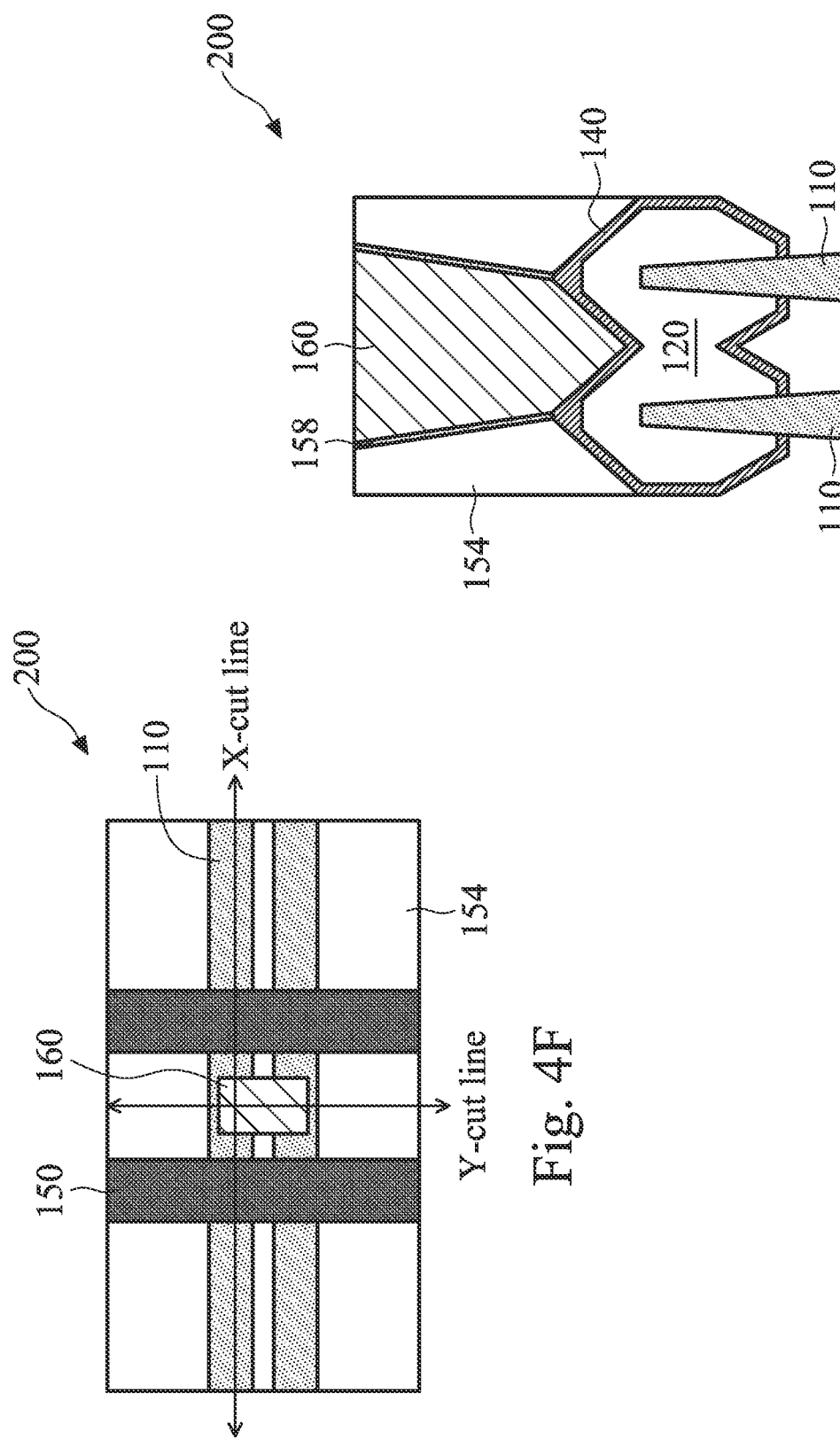

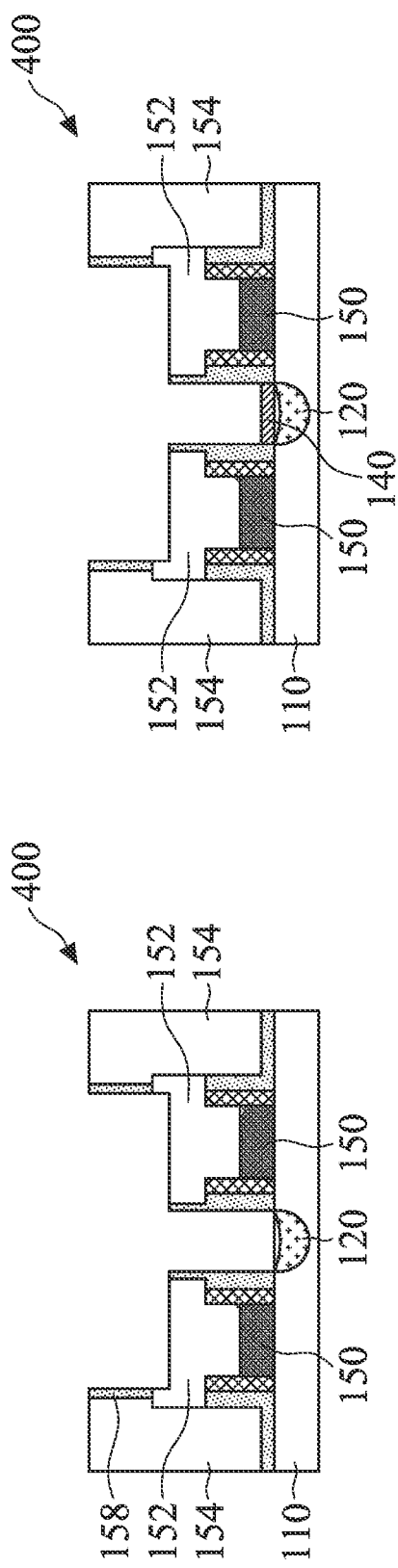
Fig. 6A
Fig. 6B
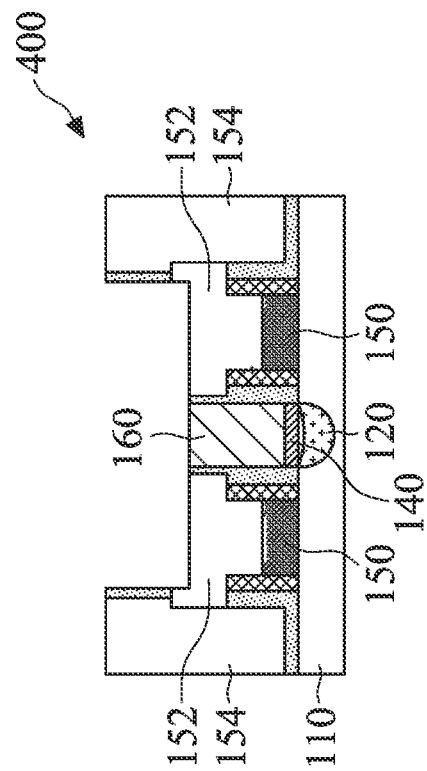
Fig. 6C

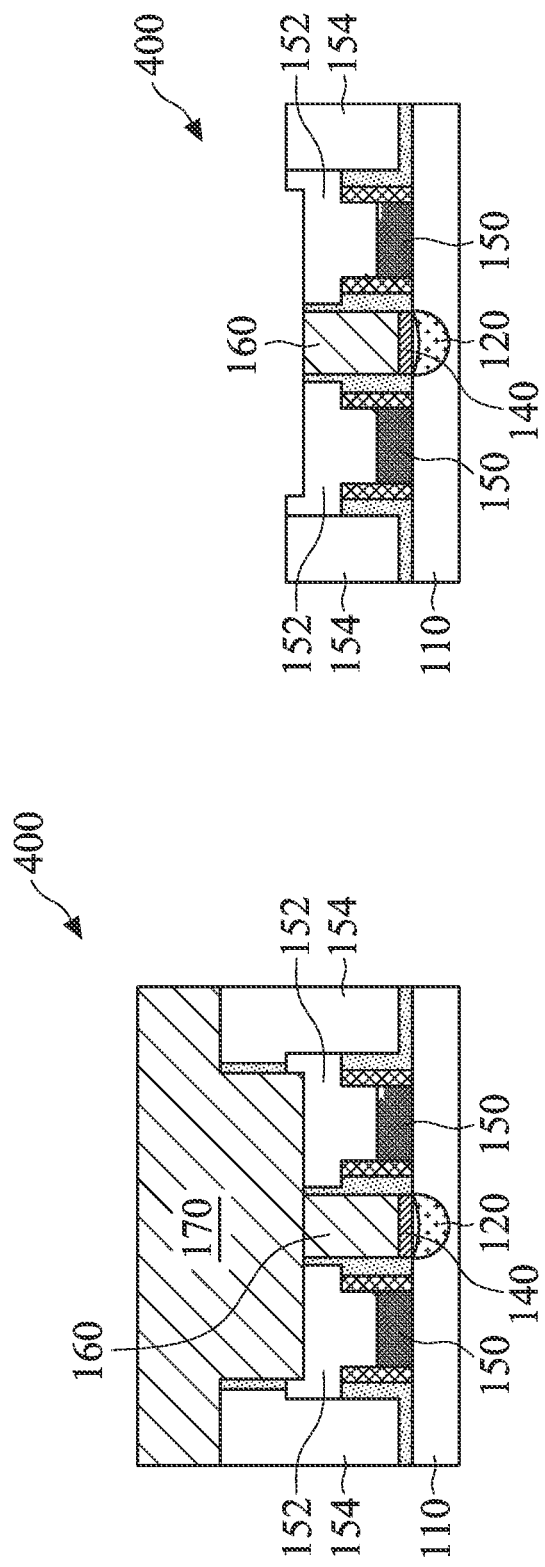

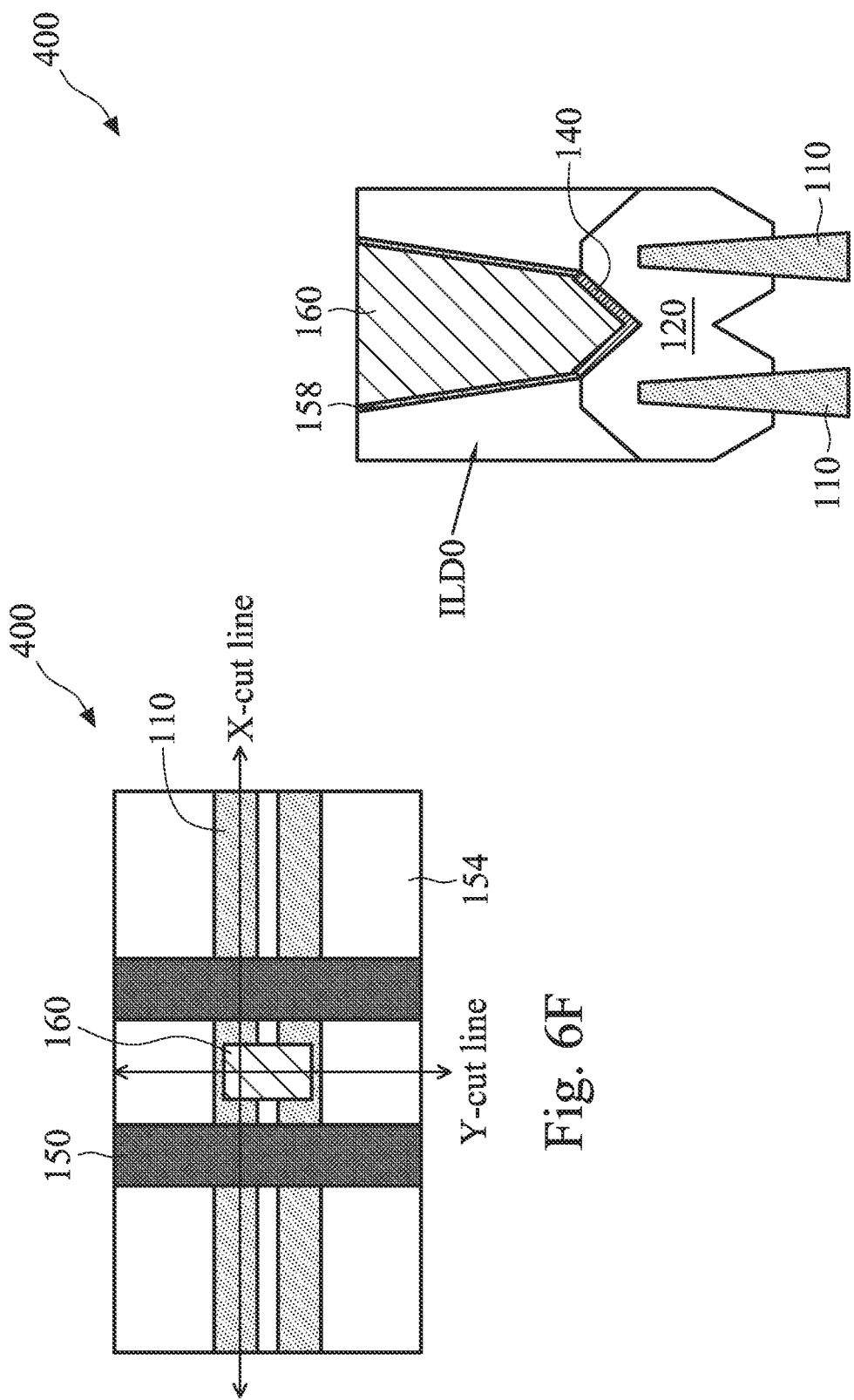

SOURCE/DRAIN METAL CONTACT AND FORMATION THEREOF

PRIORITY

This is a continuation application of U.S. patent application Ser. No. 17/352,682, filed on Jun. 21, 2021, which is a divisional application of U.S. patent application Ser. No. 16/556,922, filed on Aug. 30, 2019, now U.S. Pat. No. 11,043,558, which further claims priority to U.S. Provisional Patent Application Ser. No. 62/753,375 entitled "Source/Drain Metal Contact and Formation Thereof" filed on Oct. 31, 2018, each of which is herein incorporated by reference in its entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

For example, fabrication of various device-level metal contacts becomes more challenging as feature sizes continue to decrease. At smaller length scales, metal contacts need to fit into small spaces while minimizing contact resistances. Although current methods of forming device-level contacts are generally adequate, they have not been entirely satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A, 3B, 3C, 3D, and 3E are fragmentary cross-sectional X-cut views of a FinFET device at various stages of fabrication according to various embodiments of the present disclosure. FIGS. 3F and 3G are a fragmentary top view and a cross-sectional Y-cut view, respectively, of the FinFET device shown in FIG. 3E.

FIGS. 4A, 4B, 4C, 4D, and 4E are fragmentary cross-sectional X-cut views of another FinFET device at various stages of fabrication according to various embodiments of the present disclosure. FIGS. 4F and 4G are a fragmentary top view and a cross-sectional Y-cut view, respectively, of the FinFET device shown in FIG. 4E.

FIGS. 6A, 6B, 6C, 6D, and 6E are fragmentary cross-sectional X-cut views of yet another FinFET device at various stages of fabrication according to various embodiments of the present disclosure. FIGS. 6F and 6G are a fragmentary top view and a cross-sectional Y-cut view, respectively, of the FinFET device shown in FIG. 6E.

DETAILED DESCRIPTION

Figure 1:
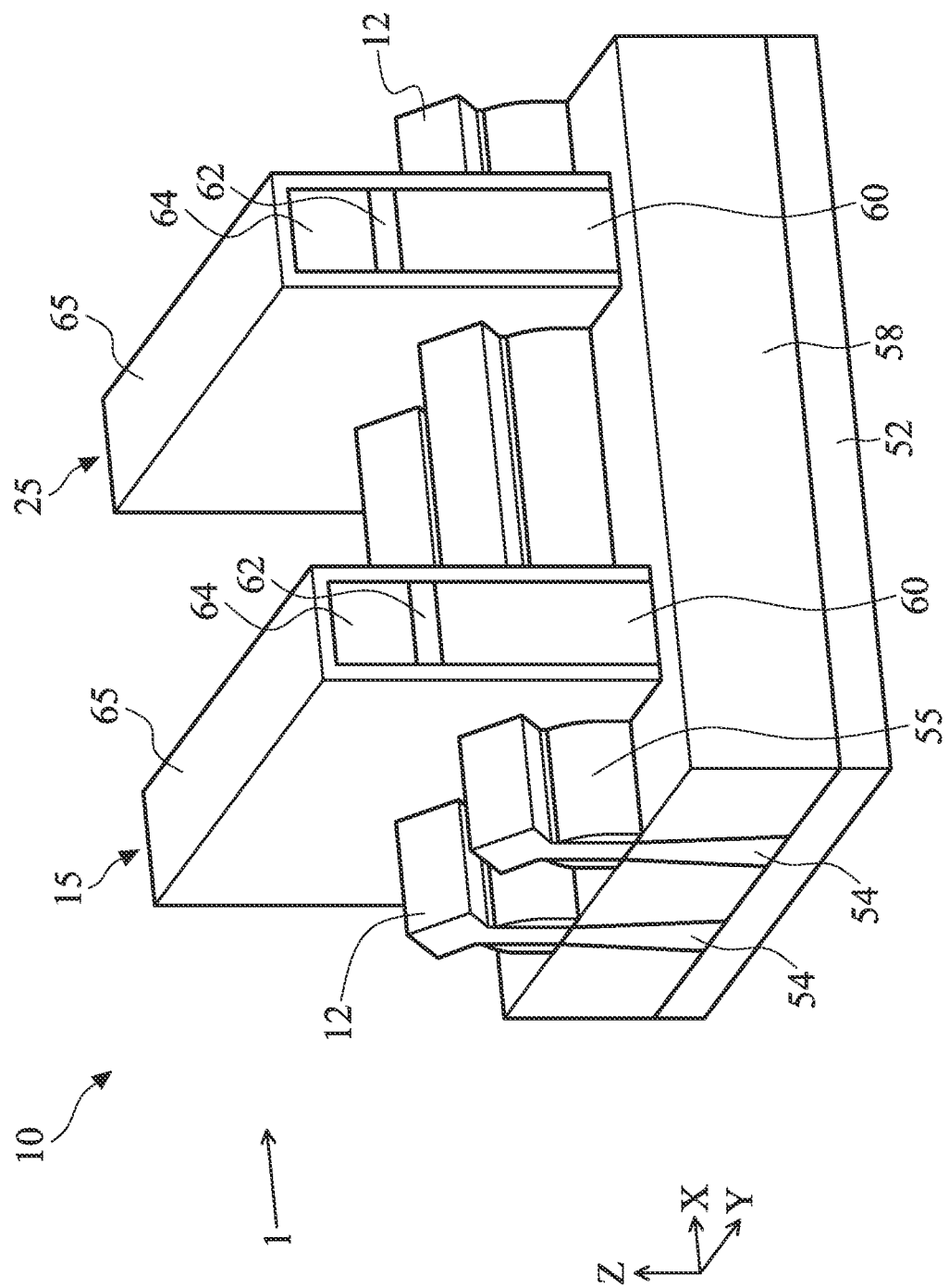
FIG. 1 is a perspective view of an example FinFET device.

It is understood that the following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is directed to, but not otherwise limited to, a method to perform semiconductor fabrication, for example an aspect of semiconductor fabrication pertaining to source/drain metal contact formation. To illustrate the various aspects of the present disclosure, a FinFET fabrication process is discussed below as a non-limiting example. In that regard, a FinFET device is a fin-like field-effect transistor device, which has been gaining popularity in the semiconductor industry. The FinFET device may be a complementary metal-oxide-semiconductor (CMOS) device including a P-type metal-oxide-semiconductor (PMOS) Fin- FET device and an N-type metal-oxide-semiconductor (NMOS) FinFET device. The following disclosure will continue with one or more FinFET examples to illustrate various embodiments of the present disclosure, but it is understood that the application is not limited to the FinFET device, except as specifically claimed. In other words, the various aspects of the present disclosure may be applied in the fabrication of two-dimensional planar transistors too.

Referring to FIG. 1, a perspective view of an example semiconductor structure 10 is illustrated. The semiconductor structure 10 includes an N-type FinFET device structure (NMOS) 15 and a P-type FinFET device structure (PMOS) 25, both disposed on a substrate 52. The substrate 52 may be made of silicon or other semiconductor materials. Alternatively or additionally, the substrate 52 may include other elementary semiconductor materials such as germanium. In some embodiments, the substrate 52 is made of a compound semiconductor such as silicon carbide, gallium arsenic, indium arsenide, or indium phosphide. In some embodiments, the substrate 52 is made of an alloy semiconductor such as silicon germanium, silicon germanium carbide, gallium arsenic phosphide, or gallium indium phosphide. In some embodiments, the substrate 52 includes an epitaxial layer. For example, the substrate 52 may include an epitaxial layer overlying a bulk semiconductor.

The semiconductor structure 10 also includes one or more fin structures 54 (e.g., Si fins) that extend from the substrate 52 in the Z-direction and surrounded by spacers 55 in the Y-direction. The fin structures 54 are elongated in the X-direction and may optionally include germanium (Ge). The fin structure 54 may be formed by using suitable processes such as photolithography or etching processes. In some embodiments, the fin structure 54 is etched from the substrate 52 using dry etch or plasma processes. In some other embodiments, the fin structure 54 can be formed by a double-patterning lithography (DPL) process. DPL is a method of constructing a pattern on a substrate by dividing the pattern into two interleaved patterns. DPL allows enhanced feature (e.g., fin) density. The fin structure 54 also includes an epitaxially-grown feature 12, which may (along with portions of the fin structure 54) serve as the source/drain of the semiconductor structure 10.

An isolation structure 58, such as a shallow trench isolation (STI) structure, is formed to surround the fin structure 54. In some embodiments, a lower portion of the fin structure 54 is surrounded by the isolation structure 58, and an upper portion of the fin structure 54 protrudes from the isolation structure 58, as shown in FIG. 1. In other words, a portion of the fin structure 54 is embedded in the isolation structure 58. The isolation structure 58 prevents electrical interference or crosstalk.

The semiconductor structure 10 further includes a gate stack including a gate electrode 60 and a gate dielectric layer below the gate electrode 60 (not shown). The gate electrode 60 may include polysilicon or metal. Metal includes tantalum nitride (TaN), nickel silicon (NiSi), cobalt silicon (CoSi), molybdenum (Mo), copper (Cu), tungsten (W), aluminum (Al), cobalt (Co), zirconium (Zr), platinum (Pt), or other applicable materials. Gate electrode 60 may be formed in a gate last process (or gate replacement process). Hard mask layers 62 and 64 may be used to define the gate electrode 60. A dielectric layer 65 may also be formed on the sidewalls of the gate electrode 60 and over the hard mask layers 62 and 64. The gate dielectric layer (not shown) may include dielectric materials, such as silicon oxide, silicon nitride, silicon oxynitride, dielectric material(s) with high dielectric constant (high-k), or combinations thereof. Examples of high-k dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, the like, or combinations thereof.

In some embodiments, the gate stack includes additional layers, such as interfacial layers, capping layers, diffusion/barrier layers, or other applicable layers. In some embodiments, the gate stack is formed over a central portion of the fin structure 54. In some other embodiments, multiple gate stacks are formed over the fin structure 54. In some other embodiments, the gate stack includes a dummy gate stack and is replaced later by a metal gate (MG) after high thermal budget processes are performed.

The gate stack may be formed by a deposition process, a photolithography process, and an etching process. The deposition process includes chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof. The photolithography processes include photoresist coating (e.g., spin-on coating), soft baking, mask aligning, exposure, post-exposure baking, developing the photoresist, rinsing, and drying (e.g., hard baking). The etching process includes a dry etching process or a wet etching process. Alternatively, the photolithography process is implemented or replaced by other proper methods such as maskless photolithography, electron-beam writing, and ion-beam writing.

FinFET devices offer several advantages over traditional Metal-Oxide Semiconductor Field Effect Transistor (MOSFET) devices (also referred to as planar transistor devices). These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip. However, FinFET fabrication may still have challenges. For example, when forming metal contacts to connect an epitaxial source/drain feature, the metal contacts need to fit into small openings above the epitaxial source/drain feature while minimizing contact resistances. Some processes use a glue layer made of titanium nitride (TiN) or tantalum nitride (TaN) between metal contacts and the epitaxial source/drain feature to enhance adhesion therebetween, but the glue layer has higher resistivity than metal contacts, which in turn increases contact resistance. Further, some methods of depositing metal contacts suffer from bottle neck and voids problems in the opening above the epitaxial source/drain feature.

To reduce contact resistance and to avoid bottle neck and voids problems, the present disclosure utilizes unique fabrication process flows to allow metal contacts to be formed over an epitaxial source/drain feature without needing any glue layer. In some embodiments, a silicide layer is formed over an epitaxial source/drain feature, and a seed metal layer is formed over the silicide layer. The silicide layer and the seed metal layer are formed before a gate replacement process in some embodiments, and formed after a gate replacement process in other embodiments. A contact metal layer is then selectively formed such that it grows on a conductive surface (e.g., the seed metal layer) but not on dielectric surfaces. A fill metal layer may be formed over the contact metal layer to facilitate a subsequent CMP process. In some embodiments, the contact metal layer is formed directly on the silicide layer (without the intervening seed metal layer). The metal contacts formed herein improve device performances by lowering contact resistance and avoiding or minimizing bottle neck and voids problems.

Figure 2:
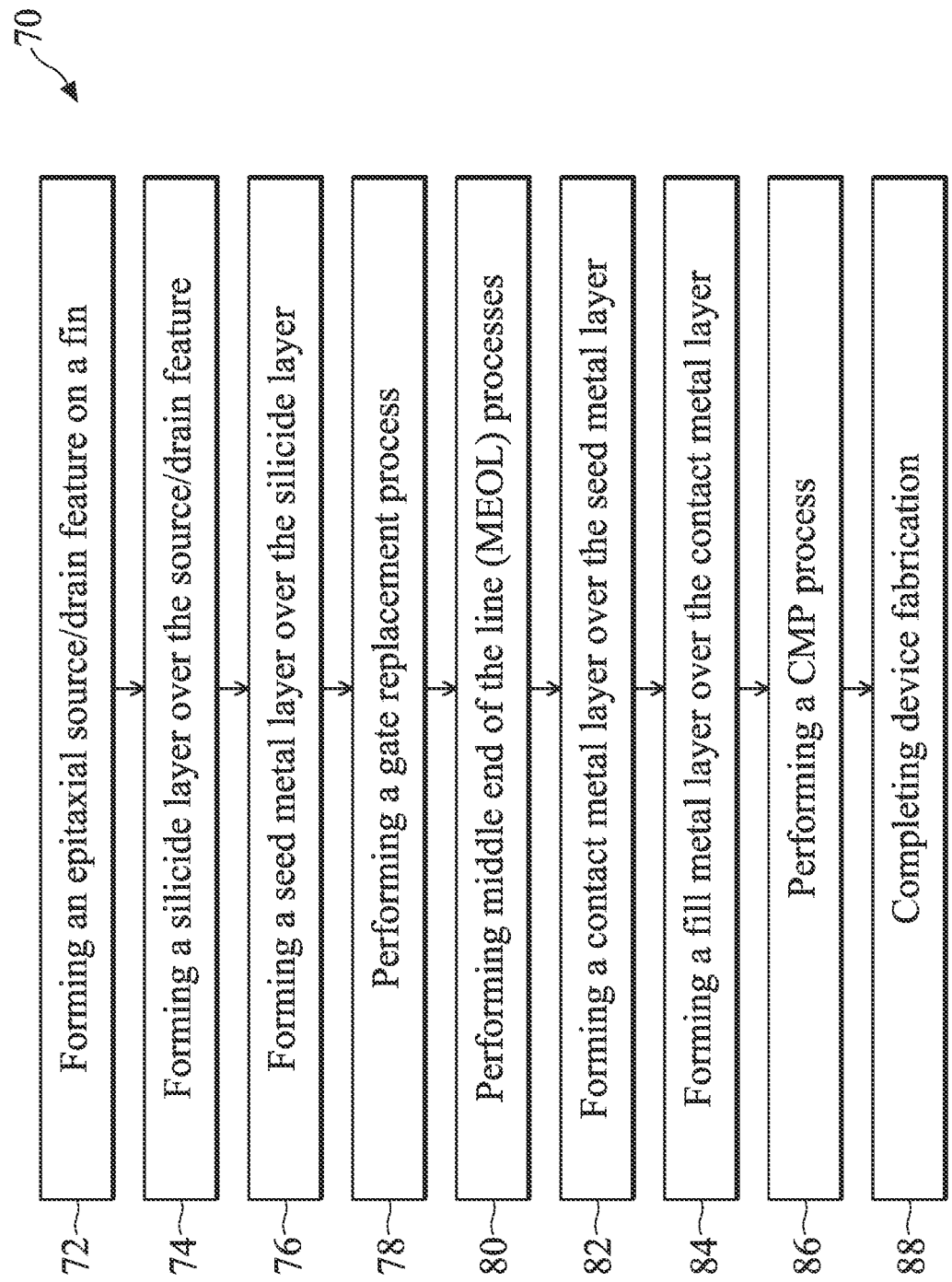
FIG. 2 is a flowchart illustrating a method for fabricating a FinFET device according to various embodiments of the present disclosure.

The various aspects of the present disclosure will now be discussed below in more detail with reference to FIGS. 2, 3A-3G, 4A-4G, 5A-5G, and 6A-6G below. In that regard, FIG. 2 is a flowchart illustrating a method for fabricating a FinFET device, FIGS. 3A-3E illustrate fragmentary cross-sectional side views of a portion of a FinFET device 100 at various stages of fabrication, FIGS. 4A-4E illustrate fragmentary cross-sectional side views of a portion of a FinFET device 200 at various stages of fabrication, FIGS. 5A-5E illustrate fragmentary cross-sectional side views of a portion of a FinFET device 300 at various stages of fabrication, and FIGS. 6A-6E illustrate fragmentary cross-sectional side views of a portion of a FinFET device 400 at various stages of fabrication. It is understood that the cross-sectional views of FIGS. 3A-3E, 4A-4E, 5A-5E, and 6A-6E correspond to the cross-sectional views taken in the x-direction shown in FIG. 1, and as such they may be referred to as X-cuts. FIGS. 4F, 5F, and 6F illustrate fragmentary top views of a portion of the FinFET devices 200, 300, and 400, respectively. FIGS. 4G, 5G, and 6G illustrate fragmentary cross-sectional Y-cut views of a portion of the FinFET devices 200, 300, and 400, respectively.

Now referring to FIG. 2, which illustrates a method 70 for fabricating a FinFET device 100 according to embodiments of the present disclosure. The method 70 is merely an example and is not intended to limit the present disclosure to what is explicitly illustrated in the method 70. Additional steps can be provided before, during, and after the method 70, and some steps described can be replaced, eliminated, or moved around for additional embodiments of the method. Not all steps are described herein in detail for reasons of simplicity. The method 70 is described below in conjunction with FIGS. 3A-3F, which are diagrammatic fragmentary cross-sectional views of the FinFET device 100 at different stages of fabrication according to embodiments of the present disclosure.

At the beginning of the method 70 (FIG. 2), a starting FinFET device (or FinFET structure) 100 is provided. Referring now to FIG. 3A, the FinFET device 100 includes fin structure 110, which may be similar to the fin structure 54 discussed above with reference to FIG. 1. The fin structure s is disposed on a substrate (e.g., the substrate 52, not shown in FIG. 3A) and may include a semiconductor material such as silicon or silicon germanium. In some embodiments, portions of the fin structure 110 serve as channel regions of transistors.

The FinFET device 100 also includes one or more dummy gate stacks 130. Each dummy gate stack 130 may include one or more material layers, such as an oxide layer (i.e., a dummy gate dielectric layer), a poly-silicon layer (i.e., a dummy gate electrode), a hard mask layer, a capping layer, and/or other suitable layers. During fabrication, a gate replacement process will be performed to replace the dummy gate stacks 130 with metal gate stacks 150, as described further below. In other words, the dummy gate stacks 130 are formed as a placeholder before forming other components, e.g., source/drain features. Once the other components have been formed, the dummy gate stacks 130 are removed and metal gate stacks are formed in their places. Each dummy gate stack 130 may be surrounded on its sidewalls by gate spacers 132. The gate spacers 132 may include a dielectric material, such as silicon oxide, silicon nitride, silicon carbide, silicon oxynitride, a low-k material (e.g., a dielectric material having a smaller dielectric constant than silicon dioxide), and/or other suitable dielectric materials. The gate spacers 132 may be a single layered structure or a multi-layered structure. As shown in FIG. 3A, each gate spacer 132 includes an inner layer (e.g., a low-k material right next to the dummy gate stacks 130) and an outer layer (further from the dummy gate stacks 130). An opening 136 separates the two gate stacks 130 in FIG. 3A. In some embodiments, a width of the opening 136 is about 8 to about 15 nm.

In step 72 of the method 70 (FIG. 2), a source/drain feature 120 is formed in the opening 136 and on the fin structure 110. The source/drain feature 120 may be formed by any suitable techniques, such as etching processes followed by one or more epitaxy processes. In one example, one or more etching processes are performed to remove portions of the fin structure 110 to form a recess therein. A cleaning process may be performed to clean the recess with a hydrofluoric acid (HF) solution or other suitable solution. Subsequently, one or more epitaxial growth processes are performed to grow an epitaxial feature in the recess. Therefore, the source/drain feature 120 is sometimes called an epitaxial source/drain feature or simply an epitaxial feature, similar to the epitaxially-grown feature 12 shown in FIG. 1. The source/drain feature 120 may be suitable for a p-type FinFET device (e.g., a p-type epitaxial material) or alternatively, an n-type FinFET device (e.g., an n-type epitaxial material). The p-type epitaxial material may include one or more epitaxial layers of silicon germanium (epi SiGe), where the silicon germanium is doped with a p-type dopant such as boron, germanium, indium, and/or other p-type dopants. The n-type epitaxial material may include one or more epitaxial layers of silicon (epi Si) or silicon carbon (epi SiC), where the silicon or silicon carbon is doped with an n-type dopant such as arsenic, phosphorus, and/or other n-type dopant.

Still referring to FIG. 3A, in step 74 of the method 70 (FIG. 2), a silicide layer 140 is formed over the source/drain feature 120. In some embodiments, the silicide layer 140 is formed to wrap around the source/drain feature 120 (e.g., as shown in the Y-cut view of FIG. 3G). In many embodiments, the silicide layer 140 includes titanium silicide (TiSi), cobalt silicide (CoSi), ruthenium silicide (RuSi), nickel silicide (NiSi), TiSiGe, CoSiGe, RuSiGe, NiSiGe, other suitable silicides, or combinations thereof. Different materials may be used depending on the application. In an example, titanium silicide is used in an n-type transistor, and cobalt silicide is used in a p-type transistor. The silicide layer 140 may be formed by any suitable method. For example, a metal layer (e.g., nickel) may be deposited over the device 100 by a deposition process such as CVD, ALD, PVD, other suitable processes, or combinations thereof. Then, the device 100 is annealed to allow the metal layer and the semiconductor materials of the source/drain feature 120 to react and form the silicide layer 140. Thereafter, the unreacted metal layer is removed, leaving the silicide layer 140 over the source/drain feature 120. In some examples, the silicide layer 140 may be formed to a thickness of about 5 nm to about 7 nm, which may range from about 33% to about 90% of the width of the opening 136.

In some embodiments, after formation, the silicide layer 140 is exposed to atmosphere or other air that contains oxygen. Thus, there is risk of the silicide layer 140 (e.g., TiSi) getting oxidized, which would increase its resistance. To prevent the silicide layer 140 from oxidation by surrounding air, its upper portion may be converted into a capping layer (not specifically shown in FIG. 3A), which may protect underlying TiSi. The capping layer can be formed using a suitable method, such as by exposing the silicide layer 140 to an inert gas or ammonia ($NH_3$). The exposure leads to reactions that form chemicals such as titanium nitride in the upper portion of the silicide layer 140, and the chemicals may block oxygen from reacting underlying TiSi. In some embodiments, the capping layer is about 2 to about 5 nm thick. Although the capping layer has a resistivity higher than that of a bottom-up metal layer 160 (described further below), the capping layer may still be used to avoid or minimize oxidation of the silicide layer 140.

Still referring to FIG. 3A, in step 76 of the method 70 (FIG. 2), a seed metal layer 142 is formed on the silicide layer 140 in the opening 136. In various embodiments, the seed metal layer 142 includes cobalt (Co), tungsten (W), ruthenium (Ru), nickel (Ni), or combinations thereof. The seed metal layer 142 may be a metal compound or alloy including Co, W, Ru, and/or Ni as well as other element(s) such as Ag, Cu, Au, Al, Ca, Be, Mg, Rh, Na, Ir, Mo, Zn, K, Cd, Ru, In, Os, Si, or Ge, or combinations thereof. The seed metal layer 142 may be formed by a suitable method such as CVD, ALD or PECVD. In some embodiments, the seed metal layer 142 is about 1 to about 5 nm thick. If too thin, the seed metal layer 142 may not provide adequate adhesion between the silicide layer 140 and the bottom-up metal layer 160. If too thick, the seed metal layer 142 may increase contact resistance because its resistivity is higher than that of the bottom-up metal layer 160.

In some embodiments, the seed metal layer 142 is selectively formed such that it grows only on a conductive surface (e.g., the silicide layer 140) but not on dielectric surfaces (e.g., the dummy gate stacks 130 and the gate spacers 132). This helps with the trench filling performance, as well as avoiding any potential bottle necks in the opening 136. The selective formation of the seed metal layer 142 may be realized by controlling process conditions including the pressure and/or the flow rate of a precursor used to form the seed metal layer 142. For example, if W is used for the metal material of the seed metal layer 142, it may be selectively deposited using process gases including tungsten fluoride, tungsten chloride, hydrogen, nitrogen, and silane, such as tungsten hexafluoride ($WF_6$)/$H_2$, $WF_6$/$H_2$/$SiH_4$, tungsten chloride ($WCl_5$)/$H_2$, where the hydrogen gas facilitates the formation and deposition of W. The temperature may be in a range between about 250 degrees Celsius and about 500 degrees Celsius, the pressure may be in a range between about 5 mTorr and about 5 Torr, and the flow rate may be in a range between about 1 standard cubic centimeter per minute (sccm) to about 1000 sccm. As another example, if Co is used for the metal material of the seed metal layer 142, $Co(tBuDAD)_2$ may be used for the deposition.

In other embodiments, however, the seed metal layer 142 may not be selective, and thus surfaces of the dummy gate stacks 130 and the gate spacers 132 may have metal materials deposited thereon, which may be removed by a chemical-mechanical planarization (CMP) process performed later. Regardless of whether the seed metal layer 142 is selective, it can be seen that the seed metal layer 142 is formed in the opening 136 over the silicide layer 140.

In the present disclosure, the contact feature is laterally in direct contact with the dielectric layer, for example, the interfacial layer or the inter-metal layer. That is, the contact feature is free of a barrier layer and a glue layer (also called an adhesion layer in some instances). No barrier layer or glue layer (e.g., made of titanium (Ti), titanium nitride (TiN), tantalum (Ta) or tantalum nitride (TaN)) is formed in the opening 136 over the silicide layer 140 (e.g., between the seed metal layer 142 and the silicide layer 140). Compared to other devices that have a glue layer (in addition to or instead of the seed metal layer 142), the seed metal layer 142 has a lower contact resistance with the silicide layer 140 because the seed metal layer 142 has a lower resistivity than a nitride-based glue layer.

Now referring to FIG. 3B, in step 78 of the method 70 (FIG. 2), a gate replacement process is performed to replace the dummy gate stacks 130 with metal gate stacks 150. For example, during a "gate-last" process, the dummy gate stacks 130 are removed and metal gate stacks 150 are formed in their places. Forming the metal gate stacks 150 involves multiple processes such as etching and depositions. In an embodiment, an etching process is performed to form gate trenches by removing the dummy gate stacks 130 using a dry etching process, a wet etching process, an RIE, other suitable methods, or combinations thereof. A dry etching process may use chlorine-containing gases, fluorine-containing gases, and/or other etching gases. The wet etching solutions may include ammonium hydroxide ($NH_4OH$), hydrofluoric acid (HF) or diluted HF, deionized water, tetramethylammonium hydroxide (TMAH), and/or other suitable wet etching solutions. In the gate replacement process, after the removal of the dummy gate stacks 130, various metal layers such as work function metal layers and fill metal layers may be formed within the gate trenches, thereby forming the metal gate stacks 150. The choice of material for a work function metal layer may be determined by an overall threshold voltage desired for the FET device 100 (e.g., n-type or p-type). Exemplary p-type work function metals include TiN, TaN, Ru, Mo, Al, WN, $ZrSi_2$, $MoSi_2$, $TaSi_2$, $NiSi_2$, WN, and/or other suitable p-type work function materials. Suitable n-type work function metals include Ti, Ag, TaAl, TaAlC, TiAlN, TaC, TaCN, TaSiN, Mn, Zr, and/or other suitable n-type work function materials. Further, a fill metal layer formed over the work function metal layer may include copper (Cu), tungsten (W), aluminum (Al), cobalt (Co), and/or other suitable materials. The fill metal layer may be formed by ALD, CVD, PVD, plating, and/or other suitable processes. After the gate replacement process, a CMP process may be performed to reduce a height of the metal gate stacks 150 to a desired level.

Still referring to FIG. 3B, in step 80 of the method 70 (FIG. 2), various middle end of the line (MEOL) processes are performed, including the formations of a sacrificial layer 152, an interlayer dielectric (ILD) layer 154, a trench 156, and spacers 158. Any suitable method(s) may be used to form these structures. In some embodiments, the sacrificial layer 152 is formed over the metal gate stacks 150 and the gate spacers 132 (e.g., using patterned deposition, or deposition plus photolithography or patterned etching). The sacrificial layer 152 may include a dielectric material such as silicon oxide, metal oxide, a high-k material, any other suitable material, or combinations thereof. The sacrificial layer 152 brings about various benefits. For example, the sacrificial layer 152 helps separate the metal gate stacks 150 from the to-be-formed over-burden metal 170. In case there is any misalignment of the over-burden metal 170 with respect to the bottom-up metal layer 160, the sacrificial layer 152 may prevent the over-burden metal 170 from electrically contacting the metal gate stacks 150. The sacrificial layer 152 may also prevent the over-burden metal 170 from damaging the later formed spacers 158. As a result, the sacrificial layer 152 increases the allowable processing window for forming the over-burden metal 170.

The ILD layer 154 is formed over the device 100 using a suitable method. The ILD layer 154 may be a bottommost ILD layer and may be referred to as an ILD0 layer. The ILD layer 154 includes a dielectric material, for example a low-k dielectric material in some embodiments, or silicon oxide in some other embodiments. After formation the ILD layer 154 is disposed adjacent the gate spacers 132.

Still in step 80, the trench 156 is formed over the opening 136 using any suitable etching method. Then, as shown in FIG. 3C, a thin layer of spacers 158 are formed in the trench 156 on the sidewalls of features including the gate spacers 132, the sacrificial layer 152, and the ILD layer 154. The spacers 158 may include a dielectric material, for example, a low-k dielectric material in some embodiments, or silicon nitride ($SiN_X$), silicon carbon nitride (SiCN), silicon oxynitride (SiON), silicon oxycarbide nitride (SIOCN), or combinations thereof in other embodiments. The spacers 158 may be formed by a deposition process followed by one or more etching and polishing processes. If not sufficiently protected, the spacer 132 may become inadvertently damaged during source/drain contact processes performed later. According to the various aspects of the present disclosure, the sacrificial layer 152 acts as a T-shaped helmet to protect the spacers 158 from potential etching damages.

Now referring to FIG. 3C, in step 82 of the method 70 (FIG. 2), a contact metal layer 160 is formed over the seed metal layer 142 via a contact formation process 162. In various embodiments, the contact metal layer 160 includes cobalt (Co), tungsten (W), ruthenium (Ru), or combinations thereof. The contact metal layer 160 may be a metal compound or alloy including Co, W, and/or Ru as well as other element(s) such as Ag, Cu, Au, Al, Ca, Be, Mg, Rh, Na, Ir, Mo, Zn, Ni, K, Cd, Ru, In, Os, Si, or Ge, or combinations thereof.

In some embodiments, the contact formation process 162 is a bottom-up growth approach; therefore, the contact metal layer 160 is also called a bottom-up metal layer. In other words, the contact formation process 162 is selective such that contact metal layer 160 is deposited on a conductive surface (e.g., the seed metal layer 142) but not on dielectric surfaces (e.g., the sacrificial layer 152, the ILD layer 154, and the spacers 158). The selective formation helps the contact metal layer 160 fill the opening 136 from bottom to top, improving filling performance. The selective formation also avoids any potential bottle necks to be formed near the top of the opening 136, which if formed may lead to void(s) in the opening 136. Due to the lack of bottle neck and voids issues, the contact metal layer 160 may fill up deep openings with high aspect ratios of height to width. In some examples, a total thickness of the silicide layer 140 and the contact metal layer 160 in the opening 136 is at least three times of a width of the contact metal layer 160 in the X-cut direction (shown in FIG. 3C). For example, the contact metal layer 160 may be formed to a thickness of about 15 nm to about 60 nm, which may range from about 100% to about 400% of the width of the opening 136.

The selective formation of the contact metal layer 160 may be realized by controlling process conditions such as CVD conditions. For example, if W is used for the metal material of the contact metal layer 160, it may be selectively deposited using CVD process gases such as $WF_6/H_2$, $WF_6/H_2/SiH_4$, $WCl_5/H_2$, where the hydrogen gas facilities the formation and deposition of W. In some embodiments, a CVD process for forming the contact metal layer 160 is performed using conditions including: a process temperature between about 100 degrees Celsius and about 500 degrees Celsius, a gas pressure between about 1 Torr and about 50 Torr, a precursor gas flow rate between about 10 sccm and about 100 sccm, and a carrier gas (e.g., hydrogen) flow rate between about 5000 sccm and about 10000 sccm. The precursor having relatively low pressure, flow rate, and/or temperature allows the selective formation of the contact metal layer 160, even though its growth speed would be slower than other conditions (e.g., higher pressure, flow rate, and/or temperature used in forming the over-burden metal 170). Because the contact metal layer 160 is formed only in the small opening 136, its growth speed is less of a concern than the over-burden metal 170, which is to be formed in the larger trench 156. Further, when the seed metal layer 142 has the same material as the contact metal layer 160, the formation of the contact metal layer 160 may be configured to go faster than other situations where the seed metal layer 142 has a different material or is not present in the device 100.

In other embodiments, the contact metal layer 160 may be selectively formed on a conductive surface using electroplating (ECP) or electron-less deposition (ELD). In ECP, a metal containing solution (e.g., copper mixed with an oxidizer) may be used under an applied voltage to extract the metal from the solution. The extracted metal (e.g., copper) is deposited on a conductive surface (e.g., the seed metal layer 142), which acts as an electrode during the ECP process. In ELD, no voltage is needed, as the metal-containing solution also contains a reducing agent. The reducing agent reacts with a metal-containing material to produce metal (e.g., copper), which is then deposited on a conductive surface (e.g., the seed metal layer 142). In some embodiments, the seed metal layer 142 and the contact metal layer 160 include different metals for optimized performance, such as the seed metal layer 142 being chosen for better adhesion with the silicide layer 140 while the contact metal layer 160 being chosen for lower resistivity and better integration with dielectric material without inter-diffusion concern. For example, the seed metal layer 142 includes tungsten while the contact metal layer 160 include copper. In another example, the seed metal layer 142 includes cobalt while the contact metal layer 160 include tungsten.

Regardless of whether the contact formation process 162 uses CVD, ECP, or ELD, it can be seen that the contact metal layer 160 is formed to fill in the opening 136 over the seed metal layer 142. Compared to other devices that have a glue layer in the opening 136, in the present disclosure, there is no glue layer in the opening 136, so the contact metal layer 160 may directly contact the spacers 158 located on the sidewalls of the opening 136. The contact metal layer 160 may directly contact the gate spacers 132 if the spacers 158 are not present on the sidewalls of the opening 136. The direct contact between the contact metal layer 160 and spacers helps reduce resistivity because the contact metal layer 160 has lower resistivity than glue layers.

Figure 3D:
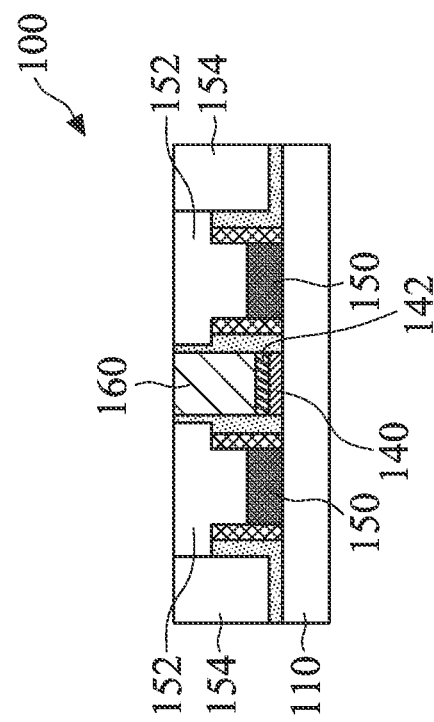
Figure 4E:
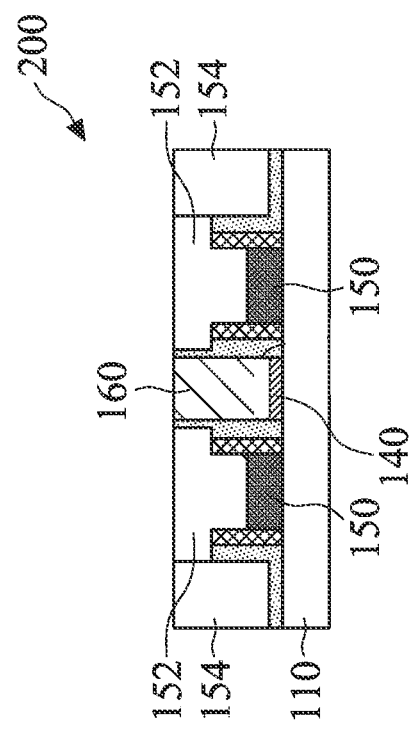

Now referring to FIG. 3D, in step 84 of the method 70 (FIG. 2), a fill metal layer 170 is formed over the device 100. In various embodiments, the fill metal layer 170 includes cobalt (Co), tungsten (W), ruthenium (Ru), or combinations thereof. The fill metal layer 170 may be a metal compound or alloy including Co, W, and/or Ru as well as other element(s) such as Ag, Cu, Au, Al, Ca, Be, Mg, Rh, Na, Ir, Mo, Zn, Ni, K, Cd, Ru, In, Os, Si, or Ge, or combinations thereof. In some embodiments, the fill metal layer 170 has the same material as the contact metal layer 160 to minimize contact resistance therebetween. As the fill metal layer 170 hangs over ("over-burdens") the contact metal layer 160, the fill metal layer 170 is sometimes called an over-burden metal layer. The fill metal layer 170 may be formed by ALD, CVD, PVD, plating, and/or other suitable processes. Because the fill metal layer 170 is formed in the larger trench 156, its formation is in some embodiments faster than the formation of the seed metal layer 142. Also, in cases there are multiple openings 136 with different sizes, the seed metal layer 142 formed in the openings 136 may vary in thickness depending on the sizes of respective openings 136 (e.g., a smaller opening 136 leads to a thicker seed metal layer 142). In such cases, the fill metal layer 170 helps make up the thickness differences of the seed metal layer 142 by creating a roughly even top surface. In some embodiments, the fill metal layer 170 has a thickness greater than that of the trench 156, therefore allowing the fill metal layer 170 to spread over the whole top surface of the device 100. A filled-up top surface with no trenches or openings improves the performance of a CMP process, described next.

Figure 3E:
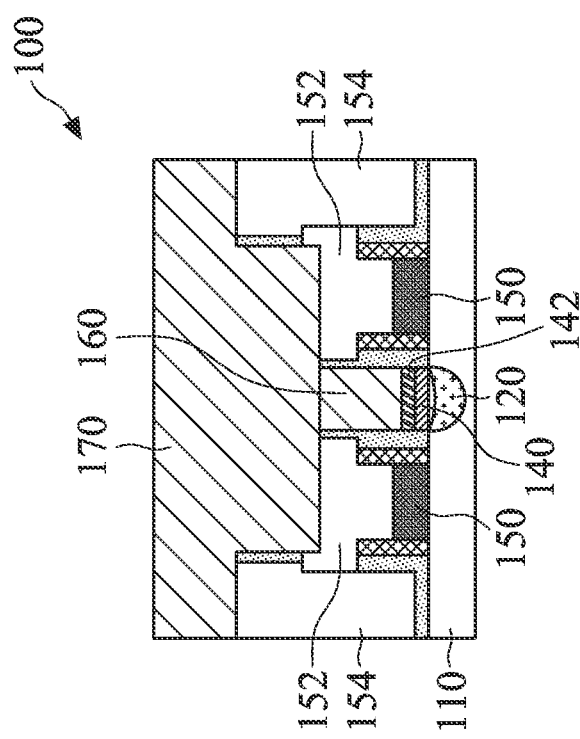

Now referring to FIG. 3E, in step 86 of the method 70 (FIG. 2), a CMP process is performed to remove an upper thickness of the device 100, thereby planarizing a top surface of the device 100. The CMP process may be performed under suitable conditions. In some embodiments, an upper thickness of about 5 to about 10 nm is removed from the device 100. As shown in FIG. 3E, the fill metal layer 170 may be removed entirely in some embodiments such that the contact metal layer 160 may be connected to other conductive features such as upper vias without any risk of the fill metal layer 170 creating potential shorted circuits. An upper thickness of the contact metal layer 160 may be removed by the CMP process. If the filled-up top surface of the device 100 has surface roughness, the CMP process helps remove such roughness. Since any openings and/or trenches have been filled up by the fill metal layer 170, the CMP encounters less or no structural buckling issues.

After the CMP process, a complete source/drain contact structure is formed including, from bottom to top, the silicide layer 140, the seed metal layer, and the planarized contact metal layer 160. FIGS. 3F and 3G illustrate top views and Y-cut views, respectively, of the device 100 after step 86, although distances and sizes are not to scale. The contact metal layer 160 may be surrounded by the spacers 158 in the X-cut view (FIG. 3E) and Y-cut view (FIG. 3G). As shown in FIG. 3G, when two fins structures 110 are disposed adjacent each other, their respective source/drain features 120 may merge into each other during the epitaxial growth process. The silicide layer 140 may wrap around the merged source/drain features 120, and the seed metal layer 142 may wrap around the silicide layer 140. The two fins structures 110 share one contact metal layer 160, which may electrically connect the merged source/drain features 120 to other features such as upper vias. In the present embodiment, the contact metal layer 160 is landing on a concave surface of the merged source/drain feature 120 with increased contact area and reduced contact resistance.

Subsequently, at step 88, the method 100 performs additional processing steps to complete fabrication of the device 100. For example, additional vertical interconnect features such as contacts and/or vias, and/or horizontal interconnect features such as lines, and multilayer interconnect features such as metal layers and interlayer dielectrics can be formed over the device 100.

The fabrication process disclosed herein may vary in terms of steps and sequences, but they all fall within the principles disclosed herein. For example, FIGS. 4A-4F are diagrammatic fragmentary cross-sectional views of a FinFET device 200 at different stages of fabrication according to embodiments of the present disclosure. The FinFET device 200 is fabricated using a first variation of the method 100. The FinFET device 200 is similar to the FinFET device 100 except differences specifically noted, thus for reasons of simplicity not all aspects are repeated herein. As shown in FIG. 4A, in this embodiment, the silicide layer 140 is formed just like FIG. 3A, but the seed metal layer 142 is not formed. Instead of forming the seed metal layer 142 (step 76), the method 100 may move directly from step 74 (for forming the silicide layer 140) to steps 78 and 80, where the method 100 performs gate replacement and middle end of the line processes, as shown in FIG. 4B.

As shown in FIG. 4C, in step 82, the contact metal layer 160 is formed over and in direct contact with the silicide layer 140 (that is, without any intervening seed metal layer 142). Since the silicide layer 140 is a conductive surface, the contact metal layer 160 may still be selectively formed such that it grows on the silicide layer 140 but not on dielectric surfaces (e.g., the sacrificial layer 152, the ILD layer 154, and the spacers 158). However, in embodiments that do not use the seed metal layer 142, the selective formation of the contact metal layer 160 may have different process conditions or parameters to achieve selective deposition since the silicide layer 140, as a growing surface, has a different composition and material characteristics. For example, in some embodiments, a CVD process for forming the contact metal layer 160 is performed using a precursor gas flow rate between about 300 sccm and about 500 sccm (e.g., about 300 sccm and about 350 sccm). Having a higher precursor flow rate helps the growth of the contact metal layer 160 on the surface of the silicide layer 140 because the silicide layer 140 has lower conductivity than the seed metal layer 142. In other words, the higher precursor flow rate allows the contact metal layer 160 to grow with reasonable rates even without the presence of the seed metal layer 142. Since the range of about 300-350 sccm is still relatively low, the formation of contact metal layer 160 maintains its selectivity. As described above, such a selective formation approach helps avoid bottle neck and voids problems. Note that, due to the absence of the seed metal layer 142 that may have the same material as the contact metal layer 160, the growth rate of the contact metal layer 160 on a different material (i.e., the silicide layer 140) may be slowed down, even with higher precursor flow rates.

As described above, to prevent the silicide layer 140 from oxidation by surrounding air, its upper portion may contain a capping layer. In some embodiments, a precursor for forming the contact metal layer 160 is selected such that the precursor would not damage the capping layer in the silicide layer 140. For example, if W is used for the metal material of the contact metal layer 160, it may be formed using gases such as $WF_6/H_2$, $WF_6/H_2/SiH_4$, where the hydrogen gas facilities the formation and deposition of W. Certain damages in the capping layer may increase contact resistance, e.g., due to increased surface roughness on the silicide layer 140. However, even if damages to the capping layer is inevitable (e.g., when material choices for the contact metal layer 160 are limited), remedial actions may be taken to mitigate such damages. In some embodiments, the silicide layer 140 goes through surface treatment before and/or during formation of the contact metal layer 160 (e.g., by using chemicals to smoothen the surface of the silicide layer 140) in order to mitigate the effect of potential surface damages.

Further, in embodiments that do not use the seed metal layer 142, the contact metal layer 160 may have weaker adhesion with the underlying silicide layer 140. As shown in FIG. 4C, to enhance the positional security of the contact metal layer 160 (and therefore prevent potential structural damages), an atom implantation process 410 may be optionally performed to implant big atoms into the spacers 158 after the formation of the contact metal layer 160. In some embodiments, atoms bigger than silicon (e.g., germanium) are injected into the spacers 158 such that the spacers 158 next to the contact metal layer 160 would be pushed laterally, thereby tightening the adhesion between the spacers 158 and the contact metal layer 160. In some embodiments, the atom implantation process 410 needs no mask for implantation because the big atoms can penetrate into dielectric layers that contain small atoms (e.g., the spacers 158), but cannot substantially penetrate into the contact metal layer 160 or the sacrificial layer 152; the reason being that the atoms contained therein are relatively big. At most, a shallow layer of implant atoms may be injected into the contact metal layer 160 or the sacrificial layer 152, which would not substantially affect the performance of the device 200.

Figure 4D:
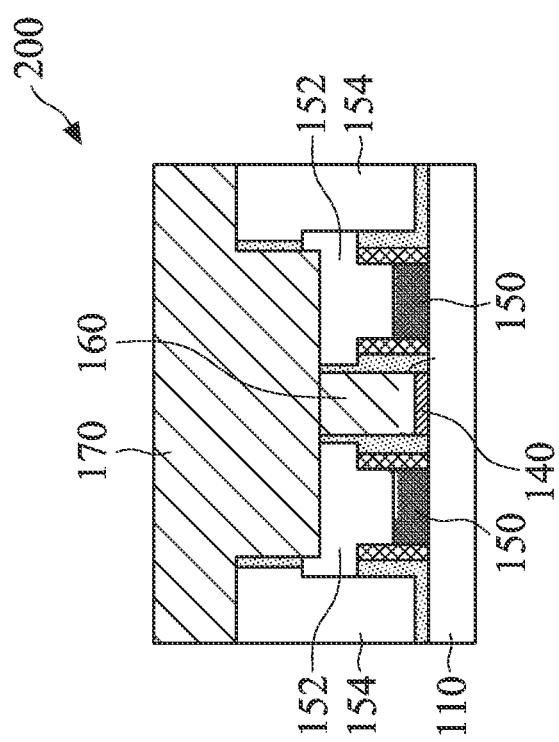

Now referring to FIG. 4D, in step 84 of the method 70 (FIG. 2), a fill metal layer 170 is formed over the device 200. Next, as shown in FIG. 4E, in step 86 of the method 70 (FIG. 2), a CMP process is performed to remove an upper thickness of the device 200, thereby planarizing a top surface of the device 200. After the CMP process, a complete source/drain contact structure is formed including, from bottom to top, the silicide layer 140 and the planarized contact metal layer 160. FIGS. 4F and 4G illustrate top views and Y-cut views, respectively, of the device 200 after step 86, although distances and sizes are not to scale. The contact metal layer 160 may be surrounded by the spacers 158 in the X-cut view (FIG. 4E) and Y-cut view (FIG. 4G). As shown in FIG. 4G, the silicide layer 140 may wrap around the merged source/drain features 120, but there is no seed metal layer 142 wrapping around the silicide layer 140. The two fins structures 110 share one contact metal layer 160, which may electrically connect the merged source/drain features 120 to other features such as upper vias.

Figure 5A:
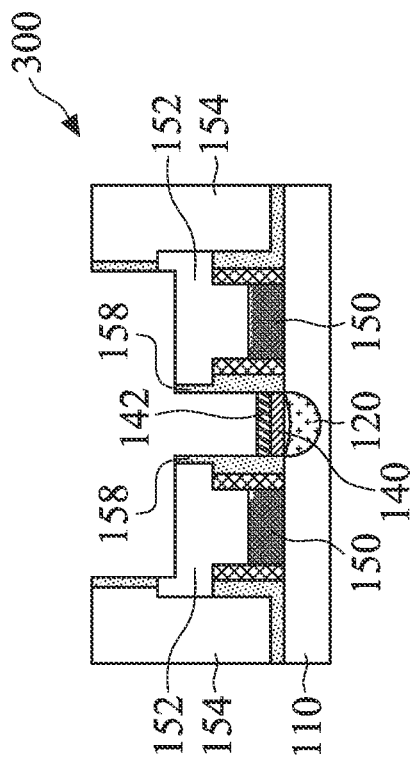
FIGS. 5A, 5B, 5C, 5D, and 5E are fragmentary cross-sectional X-cut views of yet another FinFET device at various stages of fabrication according to various embodiments of the present disclosure.
Figure 5B:
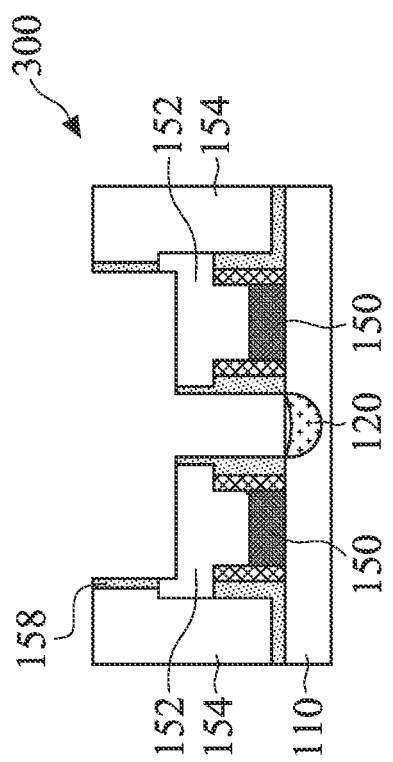

As discussed above, the method 100 may be modified within the principles disclosed herein. For example, FIGS. 5A-5F are diagrammatic fragmentary cross-sectional views of a FinFET device 300 at different stages of fabrication according to embodiments of the present disclosure. The FinFET device 300 is fabricated using a second variation of the method 100. The FinFET device 300 is similar to the FinFET devices 100 and 200 except differences specifically noted, thus for reasons of simplicity not all aspects are repeated herein. As shown in FIG. 5A, in this embodiment, a starting device 300 with a source/drain feature 120 directly goes through gate replacement and middle end of the line processes (steps 78 and 80 of the method 100) without first forming either a silicide layer or a seed metal layer. As shown in FIG. 5B, after the gate replacement and middle end of the line processes, a silicide layer 140 is formed in the opening 136 over the source/drain feature 120 (step 74), and a seed metal layer 142 is formed over the silicide layer 140 (step 76). Since the silicide layer 140 and the seed metal layer 142 are formed after the gate replacement and middle end of the line processes, as a benefit, the silicide layer 140 and the seed metal layer 142 do not have to go through certain thermal processes. As a result, the silicide layer 140 and the seed metal layer 142 may suffer from less damages and end up with more consistent properties. For example, the silicide layer 140 when formed post-gate-replacement may have a lower resistivity.

Figure 5C:
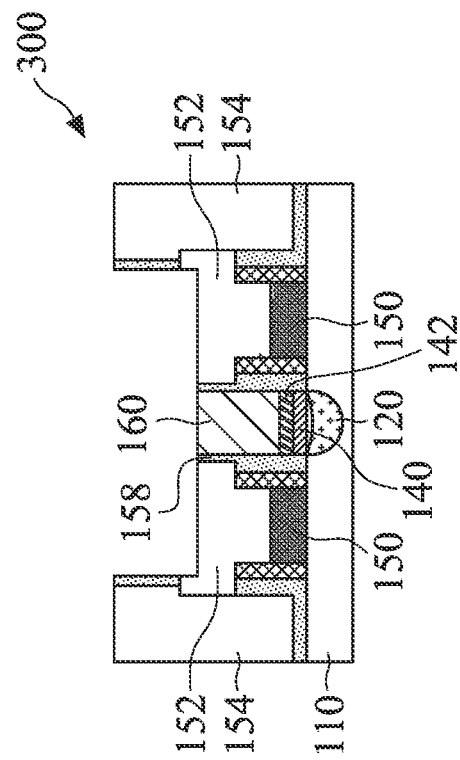
Figures 5D, 5E:
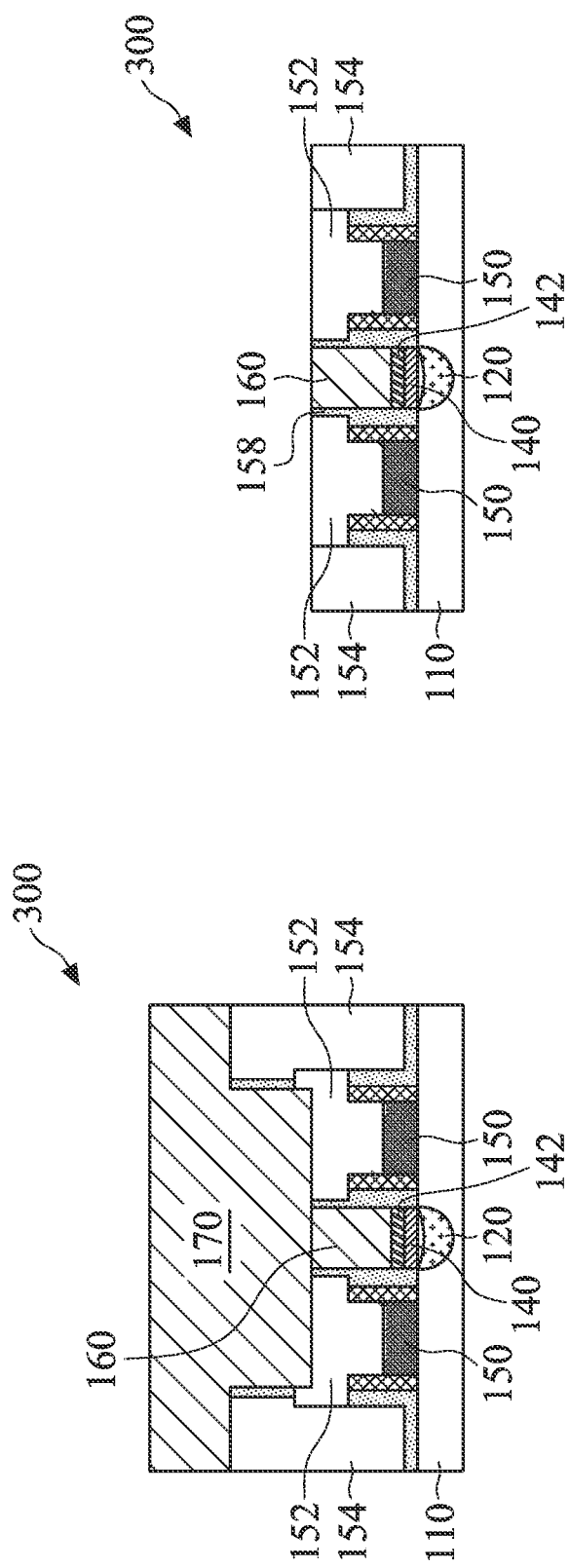
Figure 5F:
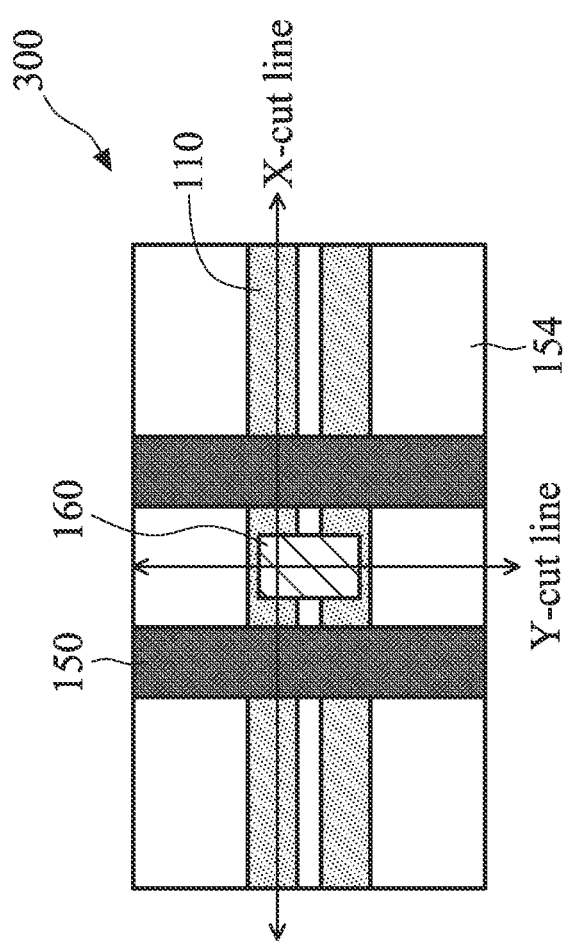
FIGS. 5F and 5G are a fragmentary top view and a cross-sectional Y-cut view, respectively, of the FinFET device shown in FIG. 5E.
Figure 5G:
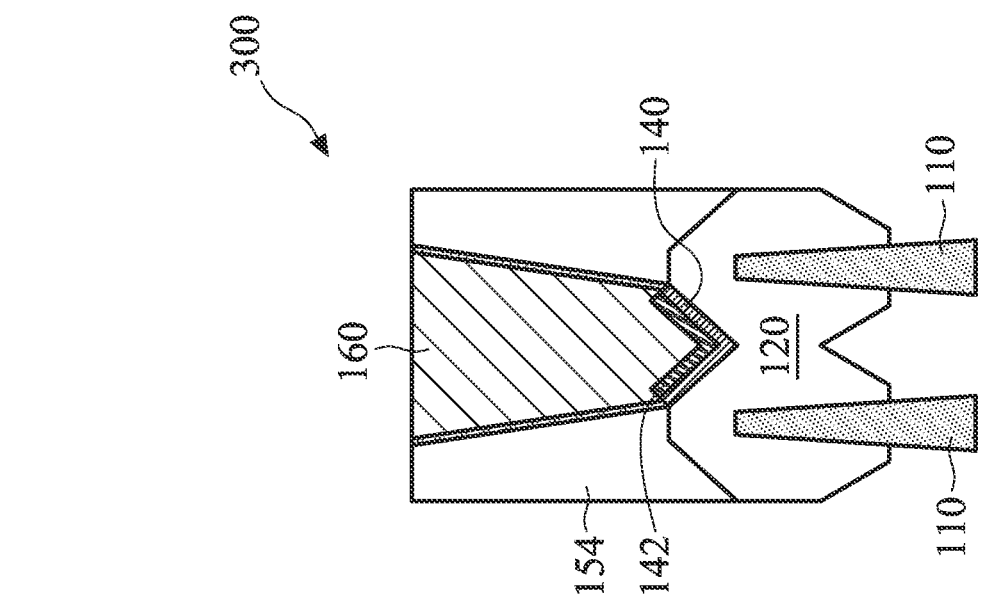

As shown in FIG. 5C, a contact metal layer 160 is formed over the seed metal layer 142 (step 82). As shown in FIG. 5D, a fill metal layer 170 is formed over the device 300 (step 84). As shown in FIG. 5E, a CMP process is performed to remove an upper thickness of the device 300, thereby planarizing a top surface of the device 300 (step 86). FIGS. 5F and 5G illustrate top views and Y-cut views, respectively, of the device 300 after step 86, although distances and sizes are not to scale. As shown in FIG. 5G, both the silicide layer 140 and the seed metal layer 142 are formed on the merged source/drain features 120, but neither the silicide layer 140 nor the seed metal layer 142 fully wraps around the merged source/drain features 120. The different Y-cut profile shown in FIG. 5G (compared to FIG. 3G) stems from the fact that the middle end of the line processes are performed (FIG. 5A) before forming the silicide layer 140 (FIG. 5B). That is, most surfaces (including sidewall surfaces) of the source/drain feature 120 have been covered by the ILD layer 154 by the time the silicide layer 140 is formed. The reduced contact area between the silicide layer 140 and the source/drain feature 120 may lead to increased contact resistance. However, as described above, the silicide layer 140 when formed post-gate-replacement may have a lower resistivity, which may offset the impact of having less contact area with the source/drain feature 120.

FIGS. 6A-6F are diagrammatic fragmentary cross-sectional views of a FinFET device 400 at different stages of fabrication according to embodiments of the present disclosure. The FinFET device 400 is fabricated using a third variation of the method 100. The FinFET device 400 is similar to the FinFET devices 100, 200, and 300 except differences specifically noted, thus for reasons of simplicity not all aspects are repeated herein. As shown in FIG. 6A, in this embodiment, a starting device 400 with a source/drain feature 120 directly goes through gate replacement and middle end of the line processes (steps 78 and 80 of the method 100) without first forming a silicide layer. As shown in FIG. 6B, after the gate replacement and middle end of the line processes, gate replacement and middle end of the line processes, a silicide layer 140 is formed in the opening 136 over the source/drain feature 120 (step 74). As shown in FIG. 6C, a contact metal layer 160 is formed over the silicide layer 140 (step 82). Note that, similar to the approach in FIGS. 4A-4G, no seed metal layer is formed between the silicide layer 140 and the contact metal layer 160. Therefore, process conditions may be similarly adjusted to facilitate the selective formation of the contact metal layer 160 directly on the silicide layer 140. As shown in FIG. 6D, a fill metal layer 170 is formed over the device 400 (step 84). As shown in FIG. 6E, a CMP process is performed to remove an upper thickness of the device 400, thereby planarizing a top surface of the device 400 (step 86). FIGS. 6F and 6G illustrate top views and Y-cut views, respectively, of the device 400 after step 86, although distances and sizes are not to scale. As shown in FIG. 6G, the silicide layer 140 is formed on the merged source/drain features 120, but the silicide layer 140 does not fully wrap around the merged source/drain features 120.

In summary, the present disclosure utilizes various embodiments each having unique fabrication process flows to form source/drain contact features. Based on the above discussions, it can be seen that the present disclosure offers advantages over conventional semiconductor devices and the fabrication thereof. It is understood, however, that other embodiments may offer additional advantages, and not all advantages are necessarily disclosed herein, and that no particular advantage is required for all embodiments. One advantage is that the present disclosure reduces contact resistance between metal layers and a source/drain feature. For example, by eliminating a glue layer made of nitride materials, higher conductive metals are used instead to reduce contact resistance. Another advantage is that the fabrication methods presented herein avoids or minimizes bottle neck and voids problems. Other advantages include compatibility with existing fabrication process flows, etc.

One aspect of the present disclosure involves a method of semiconductor fabrication. The method includes epitaxially growing source/drain feature on a fin; forming a silicide layer over the epitaxial source/drain feature; forming a seed metal layer on the silicide layer; forming a contact metal layer over the seed metal layer using a bottom-up growth approach; and depositing a fill metal layer over the contact metal layer.

One aspect of the present disclosure involves a semiconductor device. The semiconductor device includes a fin disposed on a substrate; first and second metal gate stacks disposed on the fin; first and second spacers disposed on respective sidewalls of the first and second metal gate stacks; a source/drain feature disposed on the fin and between the first and second metal gate stacks; a silicide layer disposed over the source/drain feature; a seed metal layer disposed on the silicide layer; and a bottom-up metal layer disposed over the seed layer and between the first and second spacers, wherein the bottom-up metal layer is in direct contact with the first and second spacers.

Another aspect of the present disclosure involves a semiconductor device. The semiconductor device includes a fin disposed on a substrate; first and second metal gate stacks disposed on the fin; first and second spacers disposed on respective sidewalls of the first and second metal gate stacks; a source/drain feature disposed on the fin and between the first and second metal gate stacks; and a contact feature landing on the source/drain feature. The contact feature further includes a silicide layer disposed over the source/drain feature; a seed metal layer of a first metal disposed on the silicide layer; and a bottom-up metal layer of a second metal disposed over the seed layer and between the first and second spacers, wherein the bottom-up metal layer is in direct contact with the first and second spacers, wherein the second metal is different from the first metal in composition.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A contact stack of a semiconductor device, comprising:
a source/drain feature;
a silicide layer wrapping around the source/drain feature;
a seed metal layer in direct contact with the silicide layer; and
a conductor in direct contact with the seed metal layer,
wherein the contact stack excludes a metal nitride layer between the seed metal layer and the silicide layer,
wherein the semiconductor device includes a dielectric liner disposed on a sidewall of the conductor,
wherein the seed metal layer extends on the silicide layer to beyond an outer sidewall of the dielectric liner.

2. The contact stack of claim 1, wherein the dielectric liner is in direct contact with the conductor and landing on a top surface of the seed metal layer.

3. The contact stack of claim 1, wherein the semiconductor device further includes a metal gate adjacent to the dielectric liner and an interlayer dielectric (ILD) layer disposed on the outer sidewall of the dielectric liner,
wherein a portion of the seed metal layer is directly below the ILD layer.

4. The contact stack of claim 1, wherein the seed metal layer wraps around the source/drain feature.

5. The contact stack of claim 1, wherein the seed metal layer is further disposed below a bottom surface of the source/drain feature.

6. The contact stack of claim 1, wherein the semiconductor device further includes two fins,
wherein the source/drain feature is disposed over the two fins and has a concave bottom surface, and
wherein the silicide layer includes a portion disposed along the concave bottom surface and sandwiched by the source/drain feature.

7. The contact stack of claim 1, wherein the silicide layer has a thickness of about 5 nanometers to about 7 nanometers, and
wherein the seed metal layer has a thickness of about 1 nanometer to about 5 nanometers.

8. The contact stack of claim 1, wherein the semiconductor device further includes a fin and an isolation structure disposed along a sidewall of the fin, and
wherein a portion of the silicide layer is below a topmost surface of the fin in a cross-sectional view including the fin and the isolation structure.

9. A contact stack of a semiconductor device, comprising:
a source/drain feature;
a silicide layer disposed directly on the source/drain feature and extending to a sidewall of the source/drain feature;
a seed metal layer disposed directly on the silicide layer; and
a conductor disposed on the seed metal layer,
wherein the contact stack excludes a metal nitride layer between the seed metal layer and the silicide layer,
wherein the semiconductor device includes a dielectric layer interfacing a first portion of a top surface of the seed metal layer,
wherein the conductor interfaces a second portion of the top surface of the seed metal layer.

10. The contact stack of claim 9, wherein the silicide layer includes titanium silicide (TiSi), cobalt silicide (CoSi), ruthenium silicide (RuSi), nickel silicide (NiSi), TiSiGe, CoSiGe, RuSiGe, NiSiGe, or a combination thereof.

11. The contact stack of claim 9, wherein the seed metal layer includes Co, W, Ru, Ni, Ag, Cu, Au, Al, Ca, Be, Mg, Rh, Na, Ir, Mo, Zn, K, Cd, Ru, In, Os, Si, or Ge, or combinations thereof.

12. The contact stack of claim 9, wherein the silicide layer has a thickness of about 5 nanometers to about 7 nanometers, and
wherein the seed metal layer has a thickness of about 1 nanometer to about 5 nanometers.

13. The contact stack of claim 9, wherein the semiconductor device further includes two fins,
wherein the source/drain feature is a merged source/drain feature disposed over the two fins and having a concave bottom surface, and
wherein the silicide layer includes a third portion disposed below the concave bottom surface and contacting sidewalls of the two fins.

14. The contact stack of claim 13, wherein the seed metal layer includes a fourth portion disposed below the third portion of the silicide layer and contacting the sidewalls of the two fins.

15. A contact stack of a semiconductor device, comprising:
- a source/drain feature;
- a silicide layer including a first portion disposed over the source/drain feature and a second portion extending from the first portion and disposed below a bottom surface of the source/drain feature; and
- a conductor disposed over the silicide layer.

16. The contact stack of claim 15, further comprising a seed metal layer disposed over the silicide layer.

17. The contact stack of claim 15, further comprising a seed metal layer wrapping around the silicide layer,
  wherein the seed metal layer includes a portion disposed below the second portion of the silicide layer.

18. The contact stack of claim 15, wherein the semiconductor device further includes a dielectric layer in direct contact with the contact stack.

19. The contact stack of claim 15, wherein the semiconductor device further includes a fin structure,
  wherein the source/drain feature is disposed over a top surface and sidewalls of the fin structure, and
  wherein the silicide layer is in direct contact with the sidewalls of the fin structure.

20. The contact stack of claim 15, wherein a bottom surface of the second portion of the silicide layer is a concave bottom surface defining a groove.

\* \* \* \* \*